United States Patent [19]
Siegel et al.

[11] Patent Number: 5,276,345
[45] Date of Patent: Jan. 4, 1994

[54] COMPOSITE GAAS-ON-QUARTZ SUBSTRATE FOR INTEGRATION OF MILLIMETER-WAVE PASSIVE AND ACTIVE DEVICE CIRCUITRY

[75] Inventors: Peter H. Siegel, La Canada; Imran Mehdi, Pasadena; Barbara Wilson, Altadena, all of Calif.

[73] Assignee: California Institute of Technology, Pasadena, Calif.

[21] Appl. No.: 969,472

[22] Filed: Oct. 30, 1992

[51] Int. Cl.⁵ ............... H01L 29/161; H01L 27/01; H01L 27/02; H01L 23/48
[52] U.S. Cl. ................... 257/352; 257/347; 257/275; 427/96; 427/99; 437/83; 437/84
[58] Field of Search ............... 257/347, 352; 427/96.99; 437/83, 84

[56] References Cited
U.S. PATENT DOCUMENTS

| | | | |
|---|---|---|---|
| 4,846,931 | 7/1989 | Gmitter et al. | 156/633 |
| 4,883,561 | 11/1989 | Gmitter et al. | 156/633 |
| 4,900,694 | 2/1990 | Nakagawa | 257/352 |
| 5,010,033 | 4/1991 | Tokunaga et al. | 437/83 |
| 5,013,670 | 5/1991 | Arikawa et al. | 437/83 |

OTHER PUBLICATIONS

Yablonovitch, T. Gmitter, J. P. Harbison and R. Bhat, "Extreme selectivity in the lift-off of epitaxial GaAs films," Applied Physics Letters, vol. 51 (26), pp. 2222–2224, Dec. 1987.
C. Van Hoof, W. De Raedt, M. Van Rossum and G. Borghs, "MESFET lift-off from GaAs substrate to glass host," Electronics Letters, vol. 25, No. 2, 136–137, Jan. 19, 1989.
P. H. Siegel, J. Oswald, R. J. Dengler, D. M. Sheen, and S. M. Ali, "Measured and Computed Performance of a Microstrip Filter Composed of Semi-Insulating GaAs on a Fused Quartz Substrate," IEEE Microwave and Guided Wave Letters, 1, No. 4, Apr. 1991. pp. 78–80.
W. L. Bishop, E. Meilburg, R. J. Mattauch, T. Crowe and L. Poli, "A micron-thickness, planar Schottky diode chip for terahertz applications with theoretical minimum parasitic capacitance," 1990 IEEE MTT-S Int. Mic. Sym. Digest, May 1990, pp. 1305–1308.

*Primary Examiner*—Rolf Hille
*Assistant Examiner*—Mahshid Saadat
*Attorney, Agent, or Firm*—Robert M. Wallace; Michael L. Keller

[57] ABSTRACT

The lift-off technique for transferring a preprocessed GaAs circuit to a quartz carrier is used to integrate GaAs active devices with distributed quartz microwave circuit elements (e.g., microstrip circuitry) in a single integrated circuit package. The present invention is therefore useful in making a variety of extremely rugged, low loss millimeter and submillimeter wave integrated circuits. By restricting the GaAs layer to a thin membrane and by impurity-doping the GaAs layer only in the regions of the active devices, the advantages of the quartz substrate in the presence of millimeter wave or submillimeter wave radiation are essentially retained.

11 Claims, 2 Drawing Sheets

COMPOSITE GAAS-ON-QUARTZ SUBSTRATE FOR INTEGRATION OF MILLIMETER-WAVE PASSIVE AND ACTIVE DEVICE CIRCUITRY

BACKGROUND OF THE INVENTION

1. Origin of the Invention

The invention described herein was made in the performance of work under a NASA contract, and is subject to the provisions of Public Law 96-517 (35 USC 202) in which the Contractor has elected to retain title.

2. Technical Field

The invention relates to active and passive devices for detecting millimeter wave radiation, and particularly to the integration of GaAs semiconductor devices including Schottky diodes and transistors with passive millimeter wave devices such as microstrip circuits, planar antennas and the like.

3. Background Art

At millimeter and submillimeter wavelengths, the mechanical, thermal and dielectric properties of fused or crystalline quartz are ideal for its use as a circuit substrate material. High frequency applications for quartz include many forms of integrated stripline circuits, antenna substrates and dielectric lenses. When scaling such devices for radiation wavelengths less than one micron, many discrete circuit elements become untenably small, making handling and fabrication quite difficult. When, in addition, it is desired to add prefabricated high speed GaAs active devices onto quartz microstrip or antenna circuitry, package size becomes the dominant limitation. Attempting to overcome such a limitation by combining the quartz substrate with the microstrip devices mounted thereon with GaAs substrates prior to fabricating active devices in the GaAs substrates is not possible because there is currently no method for combining or implanting GaAs and quartz prior to device processing.

Thus, it has not seemed practical to integrate GaAs devices with passive microstrip-on-quartz elements for detecting submillimeter wave radiation.

Recently, a technique has been developed for removing or "lifting-off" a very thin (less than 2 micron thick) preprocessed epitaxial layer from the top of a GaAs host wafer and transferring the entire layer to a quartz carrier, as described in E. Yablonovitch et al., "Extreme Selectvivity in the Lift-Off of Epitaxial GaAs Films," *Applied Physics Letters*, Vol. 51, No. 26, pages 2222–2224, December 1987, and C. Van Hoof et al., "MESFET Lift-Off from GaAs Substrate to Glass Host," *Electronic Letters*, Vol. 25, No. 2, pages 136–137, Jan. 19, 1989.

SUMMARY OF THE INVENTION

It is a discovery of the present invention that the molecular bonding between the thin lifted-off GaAs epitaxial layer and the quartz substrate to which it is transferred survives high-speed dicing, mild heating and mild chemical processing. Accordingly, in accordance with the present invention, the lift-off technique for transferring a preprocessed GaAs circuit to a quartz carrier is used to integrate GaAs active devices with distributed quartz microwave circuit elements (e.g., microstrip circuitry) in a single integrated circuit package. The present invention is therefore useful in making a variety of extremely rugged, low loss millimeter and submillimeter wave integrated circuits. By restricting the GaAs layer to a thin membrane and by impurity-doping the GaAs layer only in the regions of the active devices, the advantages of the quartz substrate in the presence of millimeter wave or submillimeter wave radiation are essentially retained.

In one embodiment of the invention, distributed passive circuit elements (such as, but not limited to, microstrip circuits) are formed directly on a quartz substrate in accordance with conventional techniques and a GaAs circuit element (such as, but not limited to, a Schottky diode) is formed in an epitaxial layer on a GaAs host substrate and lifted off of the host substrate in accordance with the recently developed lift-off technique referred to above, and bonded onto the quartz substrate at a desired location relative to the passive circuit elements thereof so as to be integrated therewith. Electrical connection between the passive circuit elements and the bonding pads on the GaAs circuit may be effected by bonded wiring.

In another embodiment of the invention, all elements of the integrated circuit, including the passive circuit elements (e.g., microstrip circuitry) and the active circuit elements (e.g., GaAs Schottky diodes) are all fabricated on an epitaxial GaAs layer on a GaAs host substrate. The epitaxial GaAs layer is then lifted off of the host substrate and laid on the top surface of a quartz substrate so as to bond thereto. In this embodiment, connection between a passive circuit device (e.g., a microstrip circuit) and an active device on the same epitaxial layer may be made via metal lines fabricated during the processing of the passive and active elements, as in conventional integrated circuits.

In yet another embodiment, the lifted-off GaAs epitaxial layer comprises GaAs active devices (such as photodiodes and/or transistors) suitable for detecting light. The lifted-off GaAs layer is deposited onto a quartz substrate as described above. In this embodiment, however, the quartz substrate is back-illuminated by light, which is detected by the GaAs circuit elements in the epitaxial layer deposited on the opposite side of the quartz substrate. This is the first practical back-illuminated GaAs circuitry for detecting optical radiation. Heretofore, GaAs circuits were formed on a GaAs substrate, which is not suitable for back-illumination, as is well-known in the art.

DETAILED DESCRIPTION OF THE INVENTION

Figure 2:
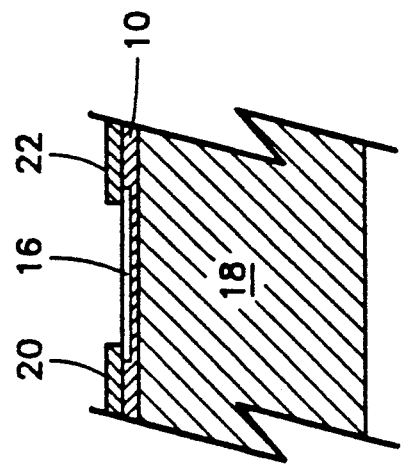
FIGS. 1 and 2 illustrate a first embodiment of the invention.
Figure 1:
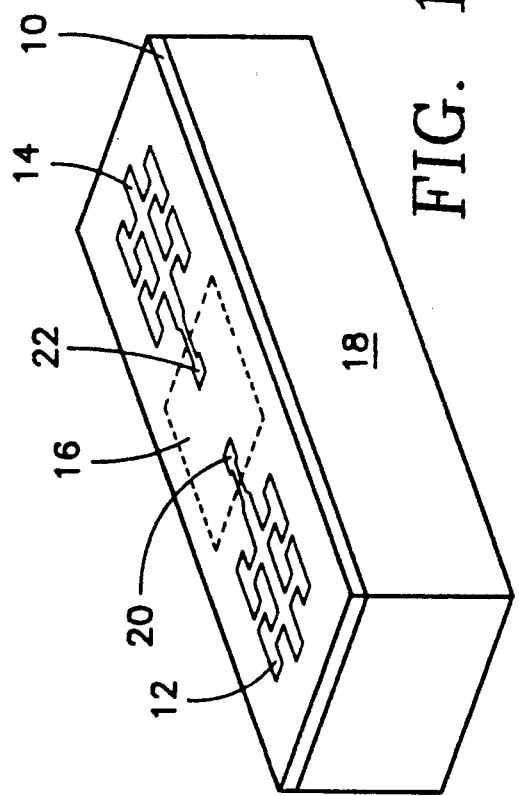

Referring to FIGS. 1 and 2, an epitaxial GaAs layer 10 previously fabricated by growth on a host GaAs substrate (not shown) includes submillimeter wave microstrip circuit elements 12, 14 and a GaAs Schottky diode pair 16. The epitaxial layer 10 is processed while it is one the host GaAs substrate in accordance with conventional techniques to form the pair of diodes 16. The submillimeter wave microstrip circuit elements 12, 14 comprise a top metalization layer formed during the processing of the GaAs epitaxial layer. As illustrated in FIGS. 1 and 2, the microstrip circuits 12, 14 terminate in conventional metal pads 20, 22 of the diode pair 16 After the processing of the epitaxial layer 10, it is lifted off of the host substrate and deposited on the top surface of a quartz substrate 18 to form the device of FIGS. 1 and 2, using the lift-off techniques described in the publications referred to above.

Figure 4:
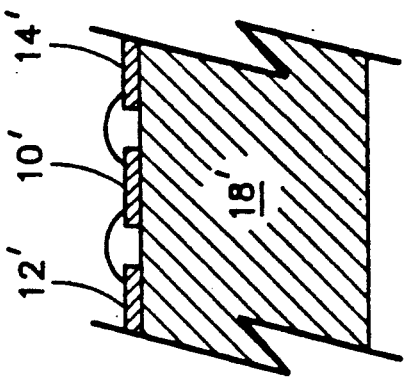
FIGS. 3 and 4 illustrate a second embodiment of the invention.
Figure 3:
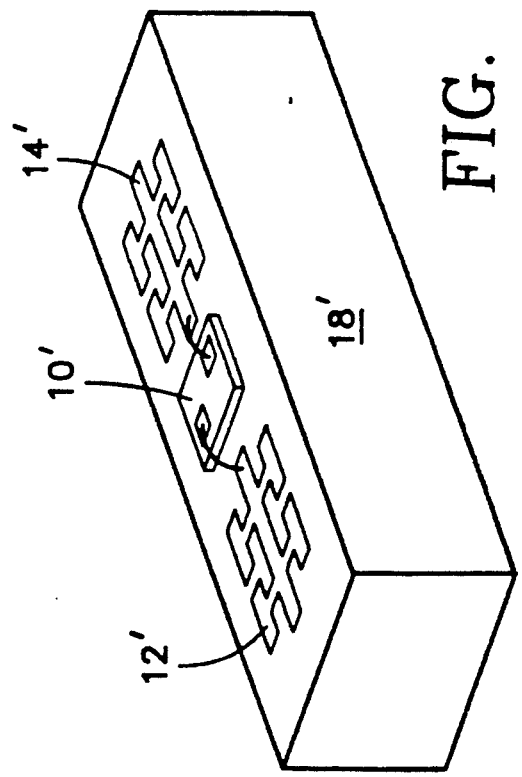

Referring to FIGS. 3 and 4, a smaller lifted-off GaAs epitaxial layer 10' comprising a discrete device (such as a GaAs Schottky diode pair) is laid on the top surface of a quartz substrate 18', in accordance with the techniques described in the above-referenced publications. The smaller lifted-off GaAs epitaxial layer 10' is much smaller than the quartz substrate 18'. Previously, mirostrip circuit elements 12', 14' have been deposited as metallization patterns directly on the surface of the quartz substrate 18' in accordance with conventional techniques. Indium bumps or soldered bonding wire connections (as shown in FIG. 3) may be employed to effect connection between the microstrip circuits 12', 14' and the discrete devices of the small epitaxial layer 10'.

Figure 5:
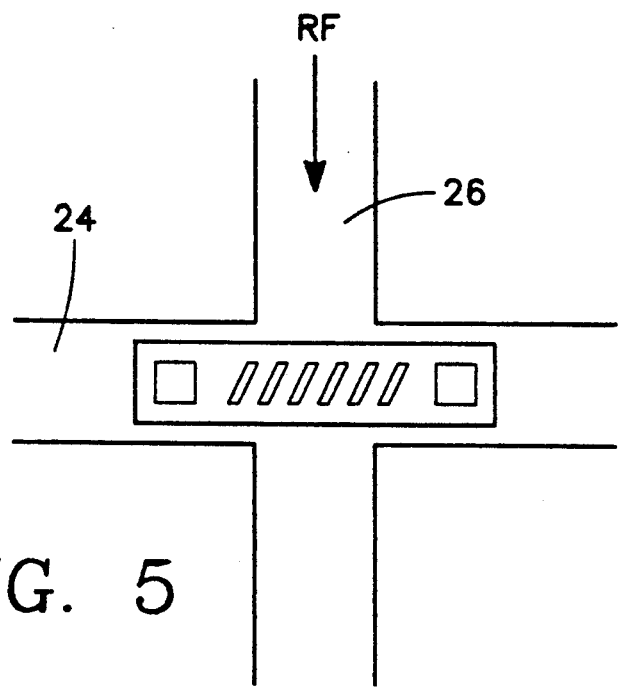
FIG. 5 illustrates how the invention is used in a submillimeter waveguide.

Referring to FIG. 5, either one of the integrated circuits of FIGS. 1 or 3 may be placed at the intersection of a pair of crossing submillimeter (or millimeter) waveguides 24, 26 as shown. The integrated circuit is actually placed within the waveguide 24 and its center is exposed to radiation received through the waveguide 26 and impinging on the diode pair of the GaAs circuit 10 or 10'.

Figure 6:
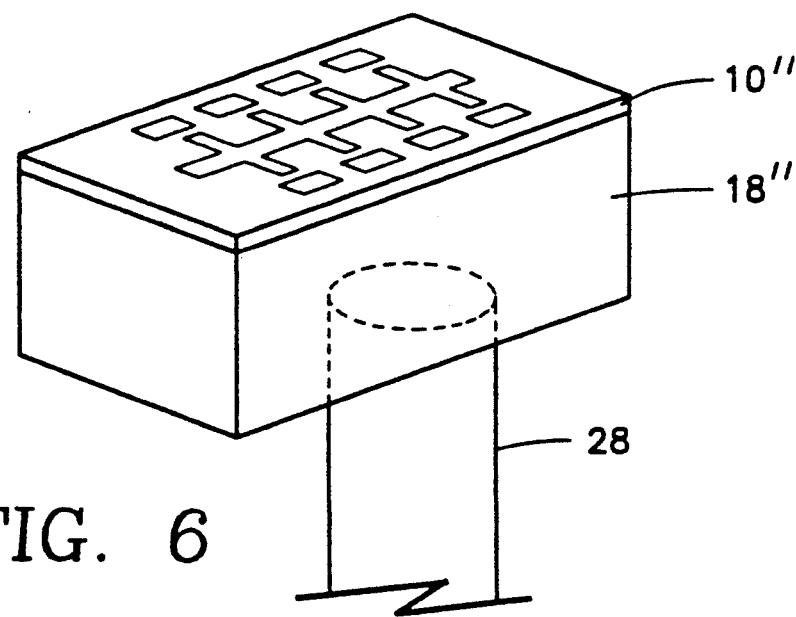
FIG. 6 illustrates how the invention is used to form a back-illuminated GaAs circuit.

FIG. 6 illustrates how to use the integrated circuit of the invention as a back-lit GaAs optical circuit. In this embodiment, a lifted-off GaAs epitaxial layer 10" comprises an integrated circuit of plural GaAs photodiodes and/or transistors responsive to optical radiation, and is bonded to the top surface of a quartz substrate 18" in the manner described above. An optical waveguide 28 or equivalent means causes optical radiation to impinge on the back surface of the quartz substrate 18". Because of the transparent qualities of the quartz substrate and the thinness of the epitaxial GaAs layer 10", the active devices in the GaAs layer 10'" are able to respond to the incident radiation. Thus, the invention provides the first practical back-illuminated GaAs optical circuit.

In one example, a number of microstrip millimeter wave filters were fabricated on an epitaxial layer previously grown on a 0.2 -by-0.2 inch GaAs wafer, and then epitaxially lifted off the wafer in accordance with the techniques described in the above-referenced publications, and placed on the top surface of a 0.0065 inch thick polished fused quartz wafer. In one implementation of this example, the epitaxial layer was allowed to simply self-bond to the quartz wafer while in a second implementation, the epitaxial layer was bonded to the quartz wafer with Norland Optical cement type NOA 61. The metallization forming the microstrip filter circuitry consisted of about 1 micron of electroplate gold grown on 1000 angstroms of evaporated gold with a 150 angstrom thick chrom adhesion layer underneath. The epitaxial layer as lifted off was 5 microns thick. The quartz wafer which received the lifted-off GaAs epitaxial layer was a 175 micron thick fused quartz type Infrasil T17. The filters employed in this example comprised a pair of microstrip filters patterned after a conventional design for a 200 GHz integrated subharmonically pumped mixer.

The invention is useful for fabricating low pass microstrip filters, micro-air bridges and planar GaAs diodes. It is also useful for integrating antenna structures with active devices using substrates other than the quartz substrate described above. In other embodiments of the invention, the lifted-off GaAs layer may be used in a membrane configuration with the carrier substrate supporting only the edges of the lifted-off GaAs layer. Furthermore, the substrate onto which the lifted-off GaAs layer is placed may be another GaAs integrated circuit substrate, the advantage here being that a GaAs integrated circuit design could be enhanced by the addition of ultra-thin GaAs discrete devices therein.

While the invention has been described in detail by specific reference to preferred embodiments thereof, it is understood that variations and modifications thereof may be made without departing from the true spirit and scope of the invention.

What is claimed is:

1. An integrated circuit operable in the millimeter to submillimeter wavelength range, comprising:
   a quartz substrate;
   an epitaxially lifted-off GaAs layer bonded to a top surface of said substrate wherein said lifted-off GaAs layer covers less than all of said top surface of said substrate;
   plural semiconductor circuit elements formed on said GaAs layer; and
   distributed passive circuit elements responsive in the millimeter to submillimeter wavelength range wherein said distributed passive circuit elements comprise top layer metalization patterns formed directly on said quartz substrate.

2. The integrated circuit of claim 1 wherein said semiconductor circuit elements comprise GaAs diodes.

3. The integrated circuit of claim 1 wherein said distributed passive circuit elements comprise microstrip circuit elements.

4. The integrated circuit of claim 1 further comprising means for electrically connecting said semiconductor circuit elements to said distributed passive circuit elements.

5. The integrated circuit of claim 1 wherein said lifted-off GaAs layer is formed by the process of forming said epitaxial layer on a host GaAs substrate and lifting off said epitaxial layer from said substrate.

6. The integrated circuit of claim 1 wherein said lifted-off GaAs layer is molecularly bonded to said quartz substrate.

7. The integrated circuit of claim 1 wherein said lifted-off GaAs layer is bonded by an adhesive substance to said quartz substrate.

8. An enhanced integrated circuit, comprising:
   a major GaAs integrated circuit substrate comprising plural interconnected semiconductor circuit elements at a top surface thereof; and
   a lifted-off GaAs, epitaxial layer comprising semiconductor circuit elements connectable to said semiconductor circuit elements of said major GaAs integrated circuit substrate and bonded to said top surface of said major GaAs integrated circuit substrate, said lifted-off GaAs epitaxial layer being at least one order of magnitude less in thickness than said major GaAs integrated circuit substrate whereby to provide ultra-thin semiconductor circuit elements for said integrated circuit.

9. The integrated circuit of claim 8 wherein said lifted-off GaAs layer is formed by the process of forming said epitaxial layer on a host GaAs substrate and lifting off said epitaxial layer from said substrate.

10. The integrated circuit of claim 8 wherein said lifted-off GaAs layer is molecularly bonded to said GaAs integrated circuit substrate.

11. The integrated circuit of claim 8 wherein said lifted-off GaAs layer is bonded by an adhesive substance to said GaAs integrated circuit substrate.

* * * * *